United States Patent
Ritter et al.

(10) Patent No.: US 6,965,383 B2
(45) Date of Patent: Nov. 15, 2005

(54) SCALING PERSISTENCE DATA WITH INTERPOLATION

(75) Inventors: Gilles Ritter, Ollon (CH); Martin Thomas Miller, Avusy (CH); Thierry Campiche, Geneva (CH)

(73) Assignee: LeCroy Corporation, Chestnut Ridge, NY (US)

( * ) Notice: Subject to any disclaimer, the term of this patent is extended or adjusted under 35 U.S.C. 154(b) by 112 days.

(21) Appl. No.: 10/013,603

(22) Filed: Dec. 11, 2001

(65) Prior Publication Data

US 2003/0107581 A1   Jun. 12, 2003

(51) Int. Cl.[7] .............................................. G09G 5/00
(52) U.S. Cl. .................. 345/606; 345/440; 345/440.1; 345/173
(58) Field of Search ............................ 345/440, 440.1, 345/173, 606

(56) References Cited

U.S. PATENT DOCUMENTS

| 3,873,918 A | * | 3/1975 | Talbert ........................ 377/11 |
| 4,821,030 A | * | 4/1989 | Batson et al. ................ 345/173 |
| 6,151,010 A | | 11/2000 | Miller et al. |
| 6,224,549 B1 | * | 5/2001 | Drongelen .................. 600/300 |
| 6,229,456 B1 | * | 5/2001 | Engholm et al. .............. 341/35 |
| 6,229,536 B1 | | 5/2001 | Alexander et al. |
| 6,335,722 B1 | * | 1/2002 | Tani et al. ................... 345/173 |
| 6,515,665 B1 | | 2/2003 | Ross |
| 6,535,233 B1 | * | 3/2003 | Smith .......................... 345/856 |
| 6,567,760 B1 | * | 5/2003 | Kikuchi et al. ............... 702/67 |
| 6,571,185 B1 | * | 5/2003 | Gauland et al. .............. 702/68 |
| 2002/0149605 A1 | * | 10/2002 | Grossman .................... 345/660 |

FOREIGN PATENT DOCUMENTS

EP                 631438 A2 * 12/1994

* cited by examiner

Primary Examiner—Matthew C. Bella
Assistant Examiner—Mike Rahmjoo
(74) Attorney, Agent, or Firm—Frommer Lawrence & Haug LLP; William S. Frommer (57) ABSTRACT

An oscilloscope apparatus for scaling and displaying persistence data using interpolation. The oscilloscope apparatus acquires a waveform and accumulates persistence data of the acquired waveform in a results buffer. The size of the persistence data is selectable by the user. A processor scales the persistence data using an interpolation algorithm to the size of a buffer in the display. The user may select a region of interest within the persistence data for scaling and display. In this manner, the persistence data can be zoomed in/out and centered on the display. The interpolation algorithm may be automatically selected or set by the user from standard, bi-linear, bi-cubic, or super-sampling algorithms.

30 Claims, 14 Drawing Sheets

SCALING PERSISTENCE DATA WITH INTERPOLATION

BACKGROUND OF THE INVENTION

The present invention relates generally to a method and apparatus for scaling persistence data accumulated in a digital storage oscilloscope for display using interpolation.

Traditionally, digital storage oscilloscopes (DSOs) capture an electrical signal (waveform) and allow the user to view a trace of the captured signal in a time (x-axis) versus amplitude (y-axis) display. In addition to simply acquiring and displaying a single signal trace, DSOs can accumulate data from a periodic signal. This repeatedly (or continuously) captured and stored data is called persistence data. Persistence data is a powerful tool for analyzing signals, since it may reveal signal features and events not discernible in a single trace.

In conventional DSOs, the persistence data is constrained by the display system. This is because the persistence data is accumulated at the same scale as the display. For example, if the display is 600 pixels wide, the persistence data is accumulated in a buffer also having a width of 600 pixels. Once accumulated, the persistence data is transferred in its entirety into the display memory, without any scaling. The problem with this approach is that resizing the display forces a reset (and another accumulation) of the persistence data. Thus, any change in the scaling results in a reset of the persistence data, or in certain conditions scale changes are simply not accepted.

Because the operator may be looking for rare events, the more persistence data that is acquired the more useful it is in analyzing the signal. However, it may take a relatively long time to acquire enough data to be useful. Thus, any time the persistence data is reset, as when scaling or zooming the display, the user not only loses valuable information but must also wait for the persistence data to again accumulate.

Moreover, when an operator zooms-in on a portion of the persistence data, he generally desires to view additional detail in the current data, not to view a new set of persistence data. Anytime a new signal is acquired, there is a risk the new data will not have the same signal pathology (i.e. the same features).

SUMMARY OF THE INVENTION

Therefore, a need exists for a capability to uncouple the display size from the size of the persistence data. Further, a means is needed to change the scale of the displayed data without resetting the persistence data, thereby letting an operator examine specific portions of the persistence data. Because the persistence data in conventional DSOs was limited to a buffer equal to the size of the display, there was no need to scale or select a region of interest. Thus, conventional DSOs have no provision for scaling (zooming in/out and centering) and/or selecting regions of interest in the persistence data. Once the persistence data buffer and display size are no longer required to match, there is a need for a capability to perform these scaling operations. Preferably, a solution to this problem should be cost effective and readily implementable.

It is therefore an object of the present invention to provide an improved oscilloscope that allows a user to scale the persistence data without requiring a re-accumulation of data.

The preferred embodiment of the invention provides an oscilloscope apparatus for scaling persistence data using an interpolation algorithm. The apparatus has an acquisition unit for acquiring a waveform. A results buffer is used to accumulate persistence data of the acquired waveform. The size of the persistence data is selectable by the user. A processor scales the persistence data using the interpolation algorithm to the size of a display buffer and outputs the scaled persistence data to the display buffer. The scaled persistence data in the display buffer is then displayed.

Another aspect of the invention is that a region of interest of the persistence data in the results buffer may be selected using a user interface for scaling by the processor. The region of interest may be of variable size such that the persistence data can be zoomed in/out and centered on the display.

Another aspect of the invention is that the interpolation algorithm may be automatically selected by the apparatus or selected by the user. The interpolation algorithm may be a standard, bi-linear, bi-cubic, or super-sampling algorithm.

The second embodiment of the invention provides a method of scaling persistence data in an oscilloscope. The user first selects a persistence data size. A waveform is then acquired and persistence data is accumulated from the waveform. The persistence data is then scaled using an interpolation algorithm to the size of a display buffer. The scaled persistence data is then output to the display buffer and displayed.

In the second embodiment, a region of interest of the persistence data to be scaled may be selected. The region of interest may be of variable size such that the persistence data can be zoomed in/out and centered when displayed.

Another aspect of the second embodiment is that the interpolation algorithm may be automatically selected by the apparatus or selected by the user. The interpolation algorithm may be a standard, bi-linear, bi-cubic, or super-sampling algorithm.

Still other objects and advantages of the invention will in part be obvious and will in part be apparent from the specification and the drawings.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings.

A persistence system constructed in accordance with the present invention is a flexible design which breaks a constraint imposed by a link/correlation between the persistence data and a display size. A fundamental key to the design is that storage of the persistence data is totally uncoupled from the display system such that it can be accumulated in a data buffer of any desired size, regardless of the display size. Hence, in accordance with the invention a new operational capability has been developed to allow a user to zoom in/out of a display of any part of the accumulated persistence data. In addition, various interpolation methods can be either manually selected by the user or automatically selected to match the size of the persistence data to the display.

The invention provides at least three distinct advantages over prior art systems. First, a two dimensional array accumulates persistence data whose size can be arbitrarily defined by either the system or the user, regardless of the display size. Second, the system provides a way for the user to select a region of interest in the persistence data buffer to be displayed. This capability allows for zoom in/out and centering operations to be performed on the displayed data. This means the user can explore the persistence data in detail without resetting the buffer. Third, the system provides a way to render any requested part of the persistence data in the display and even re-scale the data if necessary using various interpolation methods to smooth the result.

Figure 1:
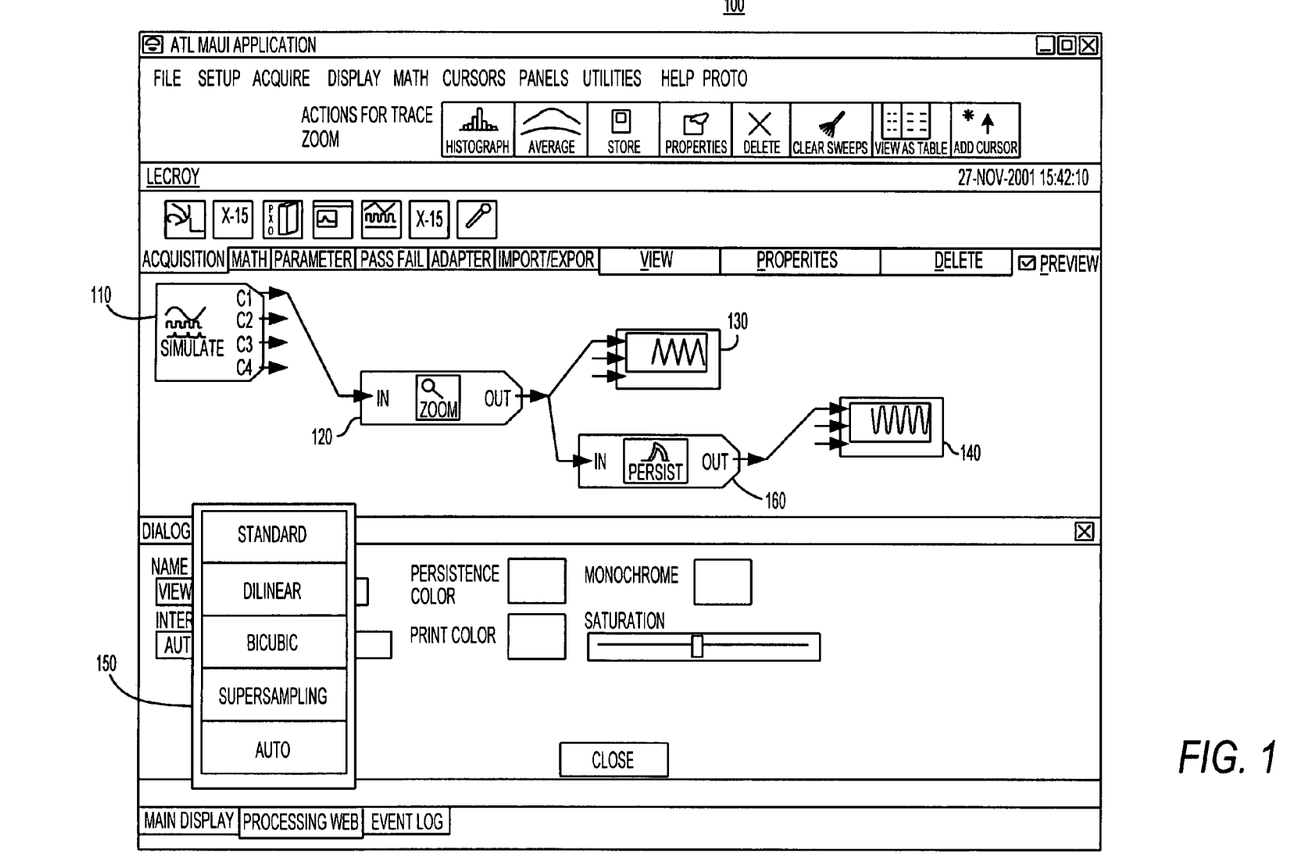
FIG. 1 is a processing web editing screen for an oscilloscope wherein a normal and persistence trace of waveform C1 are shown with a common zoom function in accordance with the invention.

The interpolation (scaling) algorithms used by the invention may be any of the numerous interpolation algorithms commonly used in standard image processing or be a custom interpolation algorithm. FIG. 1 shows a menu of interpolation algorithms 150 which may be implemented in accordance with the invention. Namely, standard, bi-linear, bi-cubic, and super-sampling algorithms. The super-sampling algorithm is only used when zooming-out the persistence data. The Auto mode automatically chooses the best interpolation algorithm depending on the amount of zoom desired. This Auto mode is a custom developed algorithm. Each interpolation algorithm is applicable to both 2D and 3D rendering of the persistence data.

FIG. 1 shows an editing screen 100 for configuring the processing and display of a DSO upon which the invention may be implemented. This editing screen 100 is part of a Processing Web Editor (PWEditor) tool for presenting a graphical representation of the configuration of a processing web to a user. The processing web defines the flow of data from the input of a DSO through various stages of processing to the display device and may be used to configure various hardware elements of the DSO. The processing web is described in more detail with reference to FIG. 15, hereinbelow.

Figure 1A:
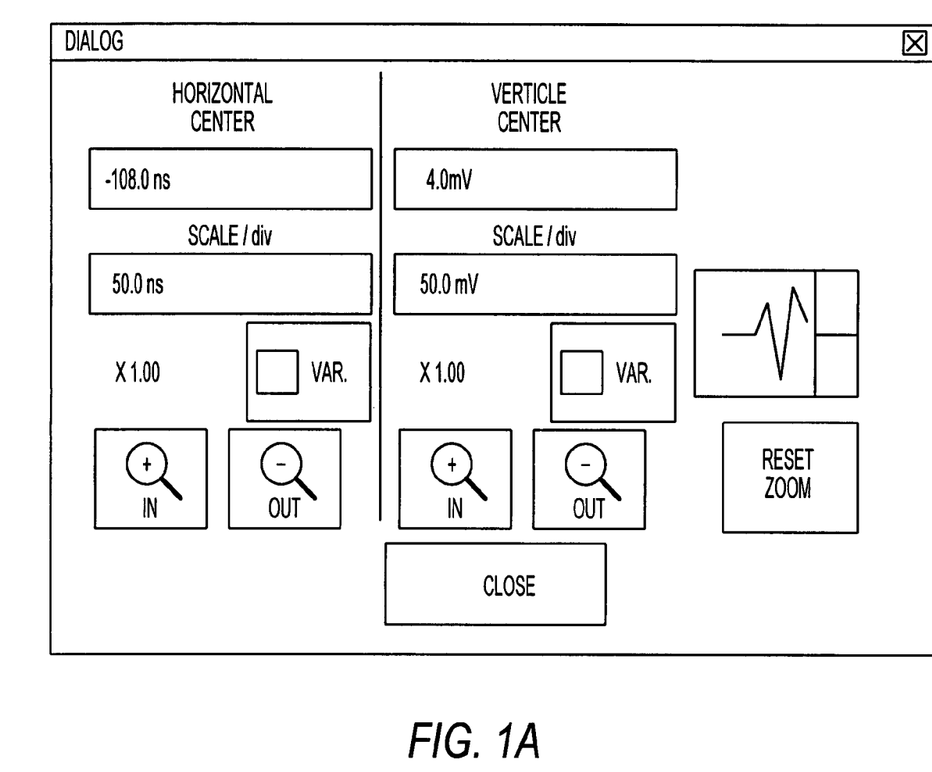
FIG. 1A is a control panel for the zoom function 120 shown in FIG. 1.

In FIG. 1, editing screen 100 shows that an acquired input waveform C1 110 is processed by a zoom function 120 and persistence data 160 of C1 will be accumulated. The oscilloscope displays both a normal trace 130 of C1 and a persistence trace 140 with a common zoom function 120. Inserting the zoom function 120 before the accumulation 160 of persistence data allows the user to define the resolution of the persistence data. In this manner, the zoom function 120 lets the operator decide which part of the persistence data is to be viewed. (This is not related to the interpolation) The operation of the zoom function 120 is controlled by the parameters set in a control panel, as shown in FIG. 1A. Alternately, the zoom function may be omitted with scaling performed by adjusting the display of the persistence trace 140. The editing screen also shows that the auto mode has been selected from the interpolation algorithm menu 150.

Figure 2:
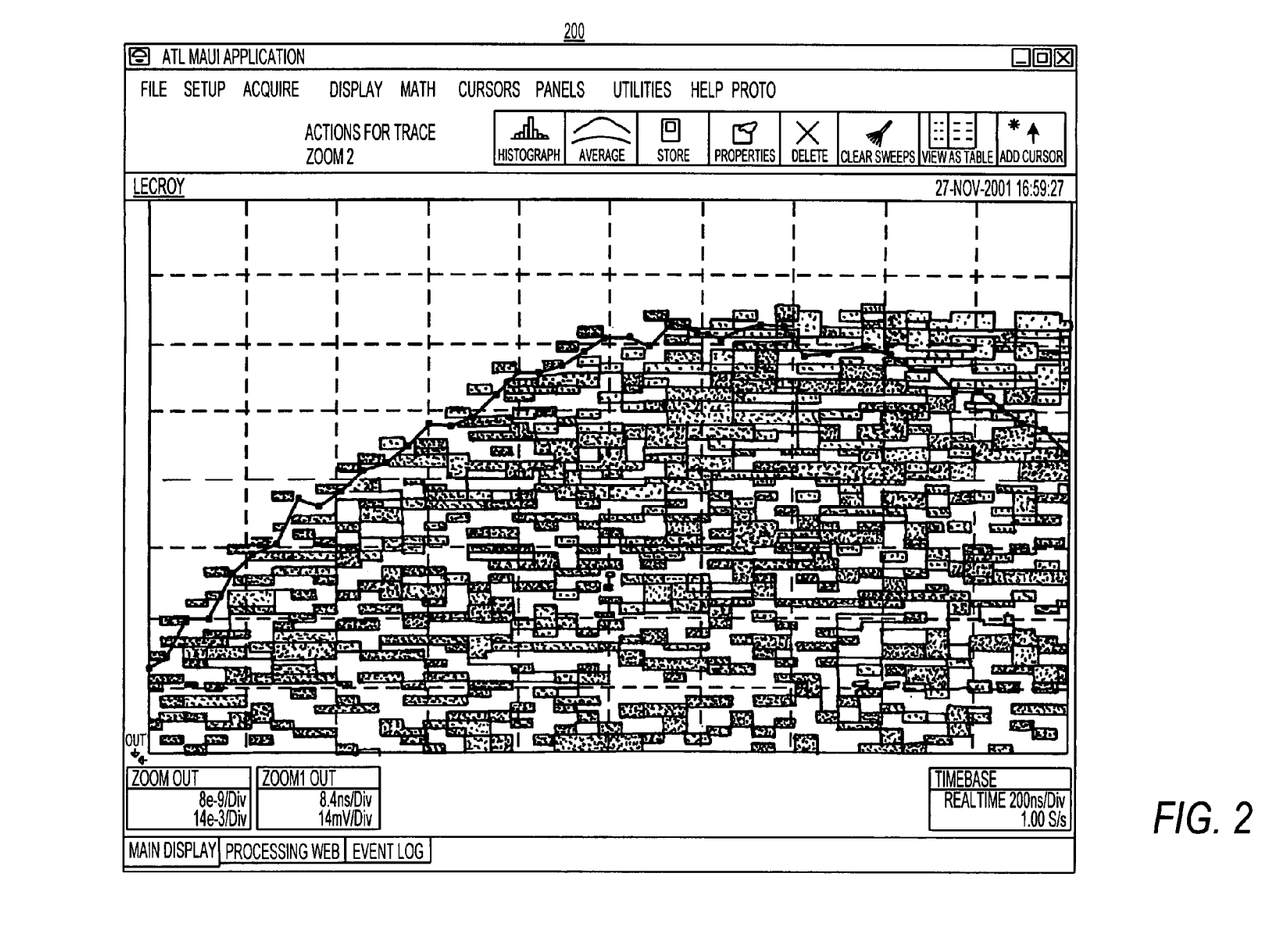
FIG. 2 is an oscilloscope display, as configured by the processing web shown in FIG. 1, showing normal and persistence traces of waveform C1 both zoomed-in using a standard interpolation algorithm.
Figure 3:
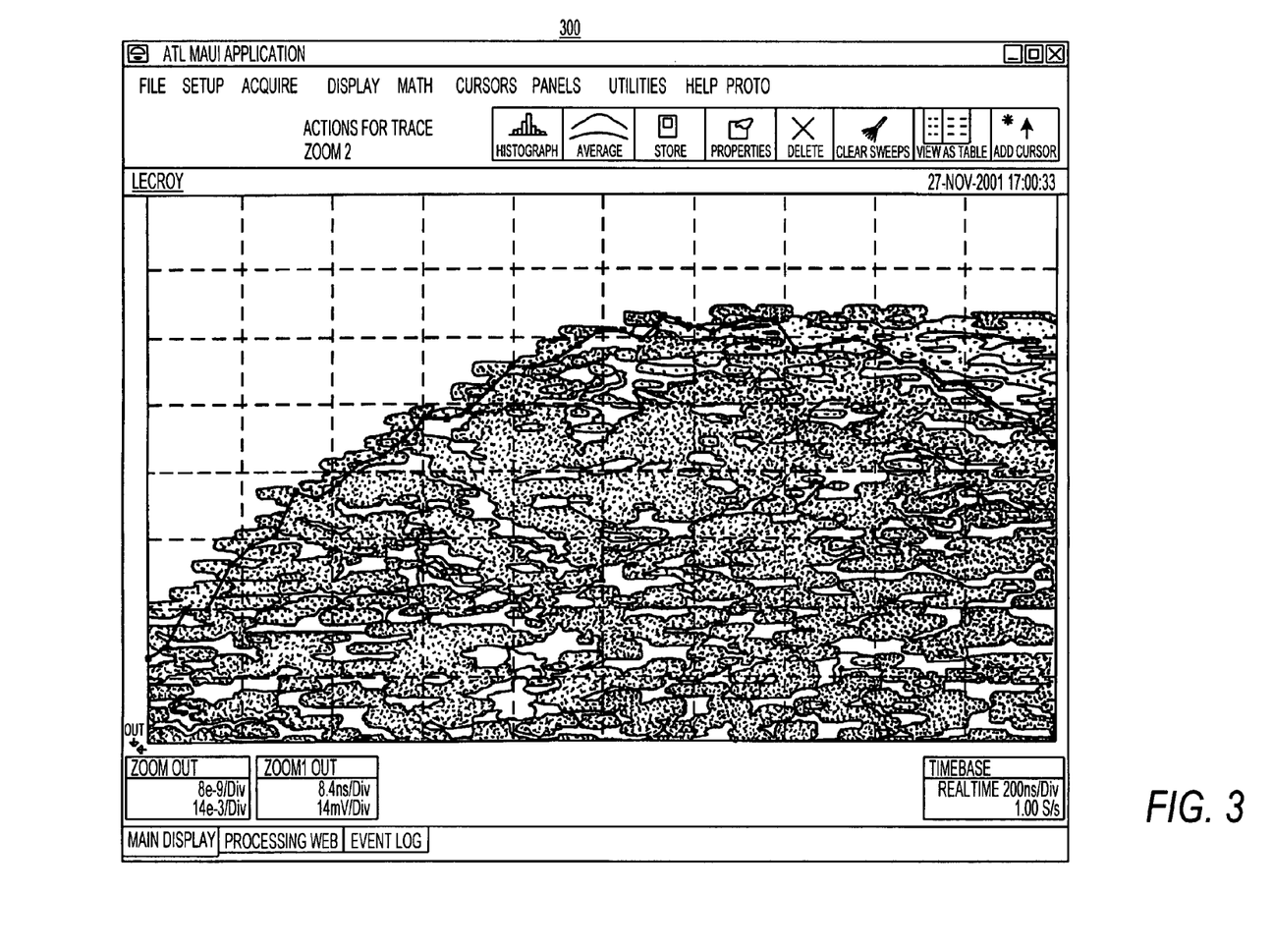
FIG. 3 is an oscilloscope display, as configured by the processing web shown in FIG. 1, showing normal and persistence traces of waveform C1 both zoomed-in using a bi-linear interpolation algorithm.
Figure 4:
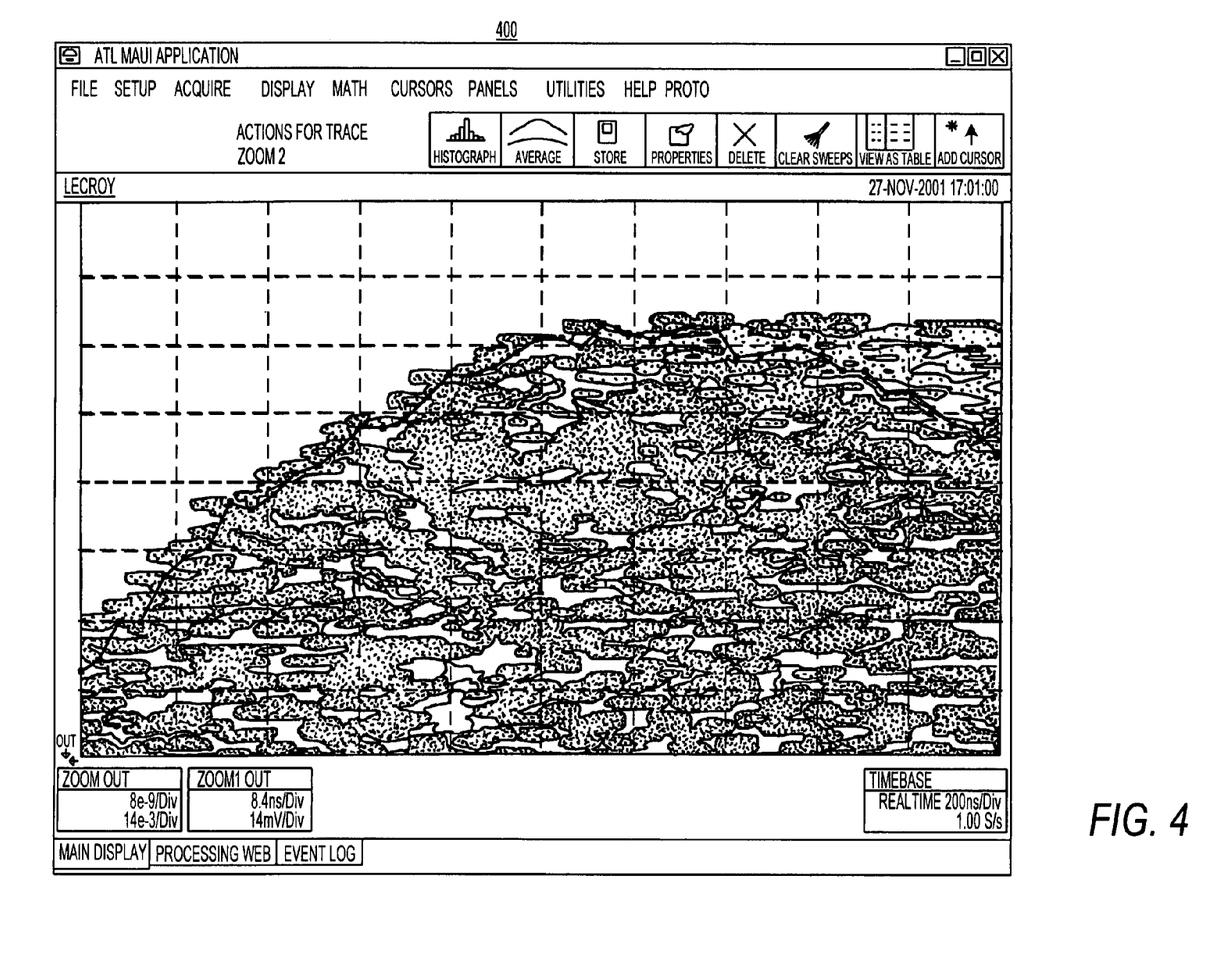
FIG. 4 is an oscilloscope display, as configured by the processing web shown in FIG. 1, showing normal and persistence traces of waveform C1 both zoomed-in using a bi-cubic interpolation algorithm.
Figure 5:
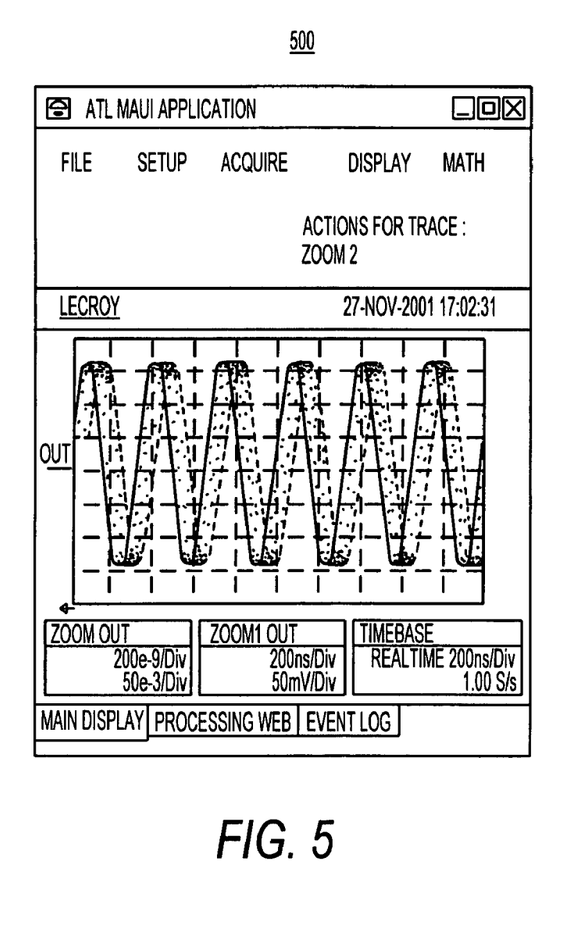
FIG. 5 is an oscilloscope display, as configured by the processing web shown in FIG. 1, showing the normal and persistence traces of FIG. 2 zoomed-out.
Figure 6:
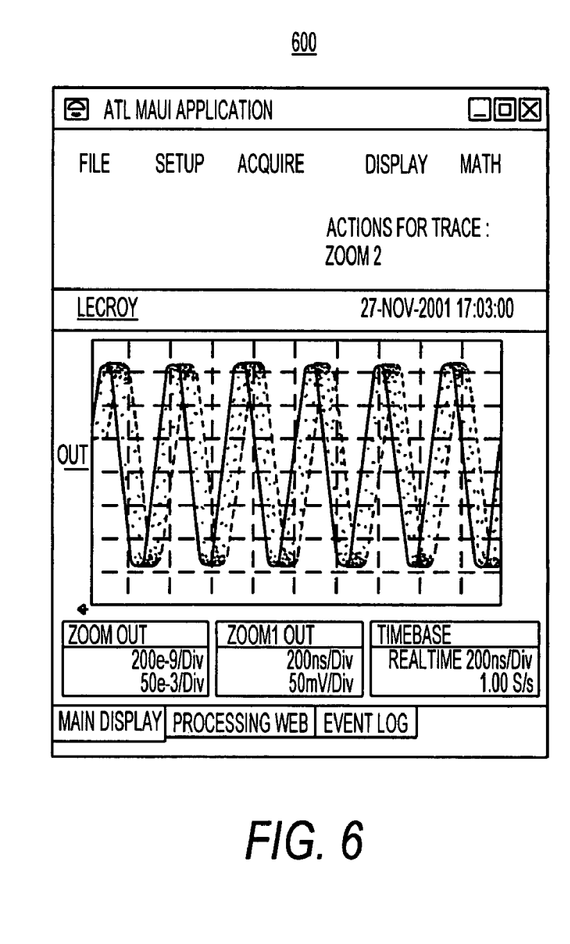
FIG. 6 is an oscilloscope display, as configured by the processing web shown in FIG. 1, showing the normal and persistence traces of FIG. 3 zoomed-out.
Figure 7:
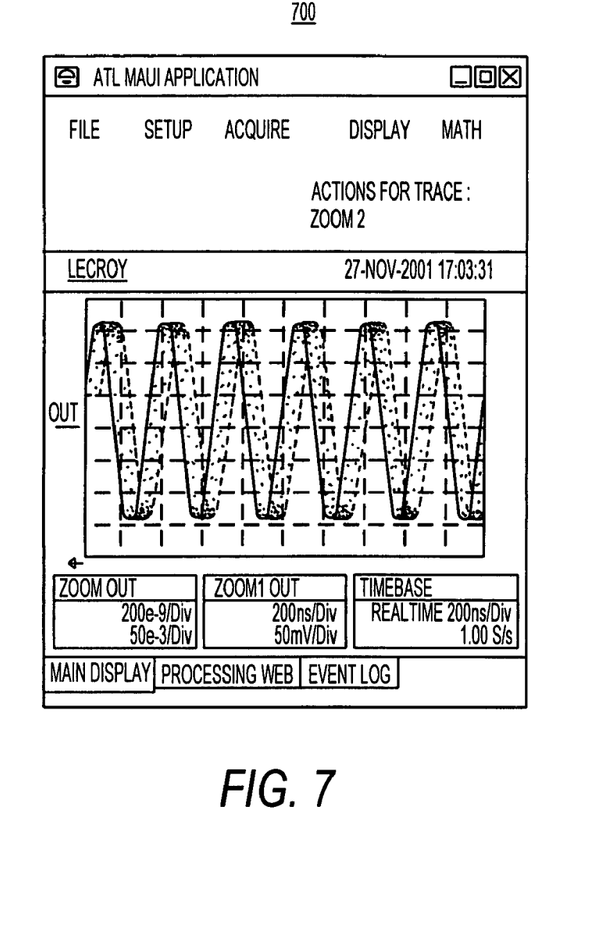
FIG. 7 is an oscilloscope display, as configured by the processing web shown in FIG. 1, showing the normal and persistence traces of FIG. 4 zoomed-out.
Figure 8:
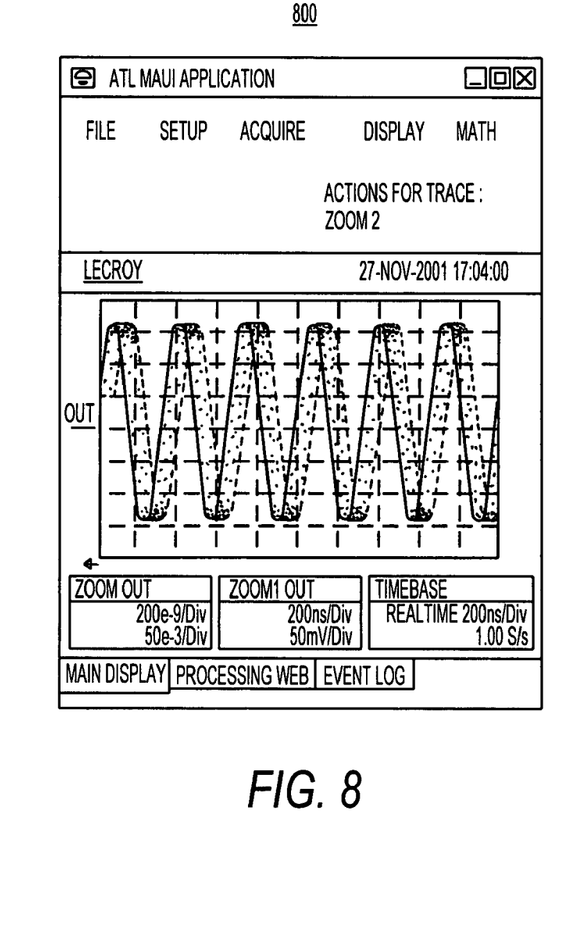
FIG. 8 is an oscilloscope display, as configured by the processing web shown in FIG. 1, showing the normal and persistence traces of waveform C1 zoomed-out using a super-sampling interpolation algorithm.

FIGS. 2, 3, and 4 show an oscilloscope display, as configured by the processing web shown in FIG. 1, showing the normal and persistence traces of waveform C1 both zoomed-in using the standard, bi-linear, and bi-cubic interpolation algorithms, respectively.

Likewise, FIGS. 5, 6, 7, and 8 show an oscilloscope display, as configured by the processing web shown in FIG. 1, showing the normal and persistence traces zoomed-out using the standard, bi-linear, bi-cubic, and super-sampling interpolation algorithms, respectively.

Figure 9:
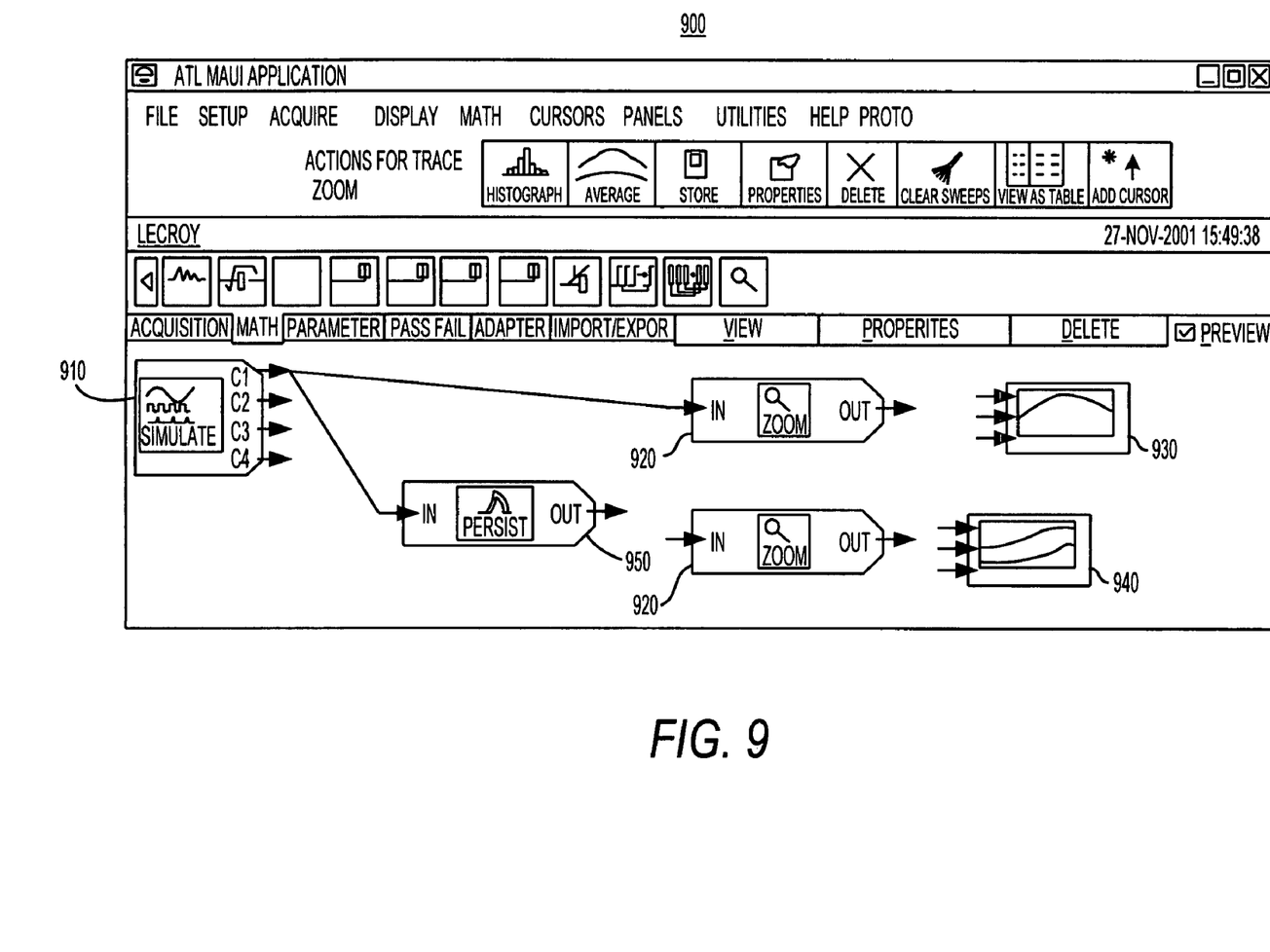
FIG. 9 shows a processing web editing screen for an oscilloscope wherein a normal and persistence trace of waveform C1 are shown each with an individual zoom function in accordance with an alternate embodiment of the invention.

FIG. 9 shows an editing screen 900 wherein an acquired input waveform C1 910 is accumulated as persistence data 950 followed by a zoom function 920 and display 940. In addition, the waveform C1 is also shown as a normal trace 930 with its own zoom function 920. Note the zoom function is inserted after the persistence data is accumulated. This means the resolution of the accumulation is not affected by the zoom function. Rather, the display looks only to the specified portion of the persistence data.

Figure 10:
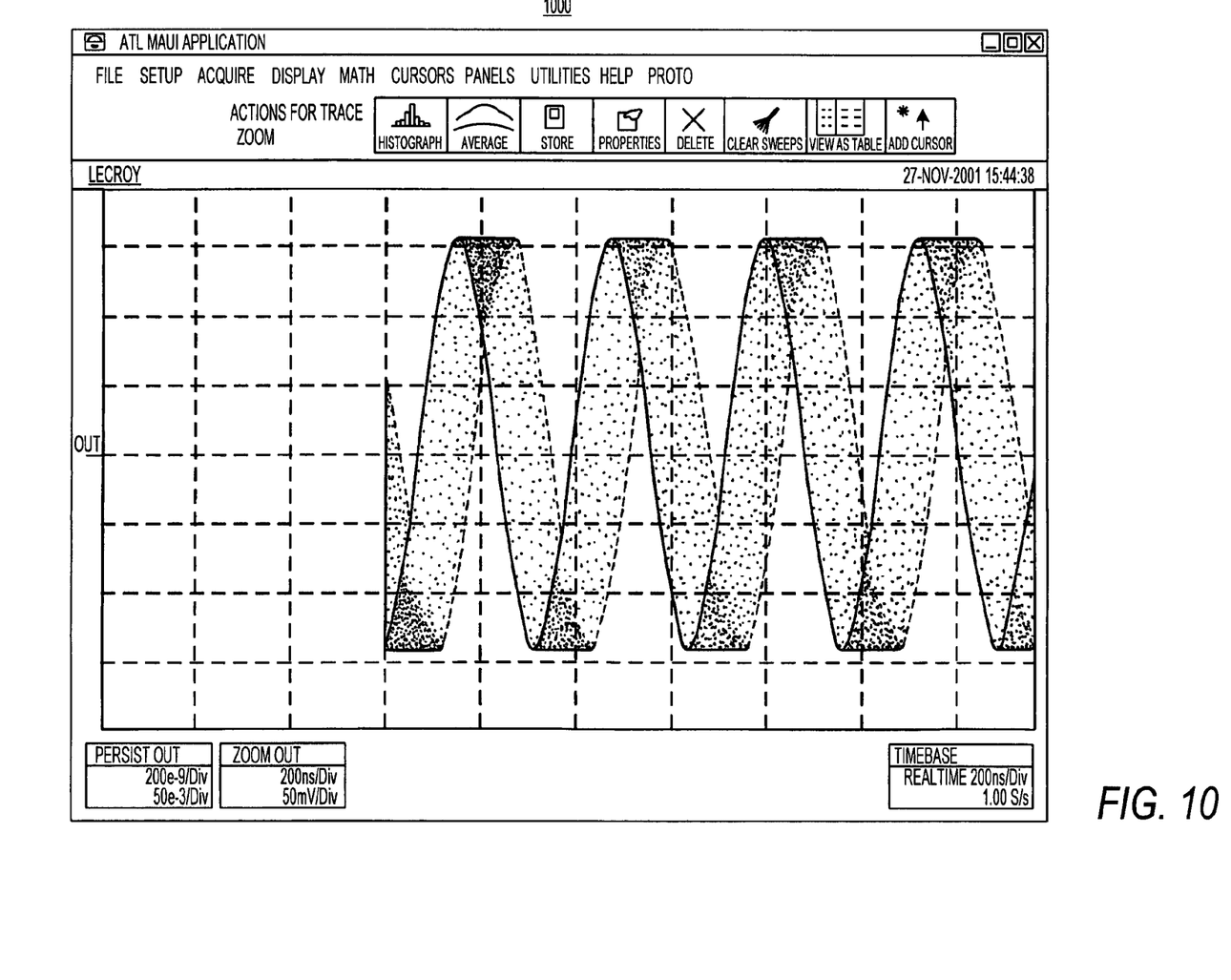
FIG. 10 is an oscilloscope display, as configured by the processing web shown in FIG. 9, showing normal and persistence traces of waveform C1 both scaled by the same amount.
Figure 11:
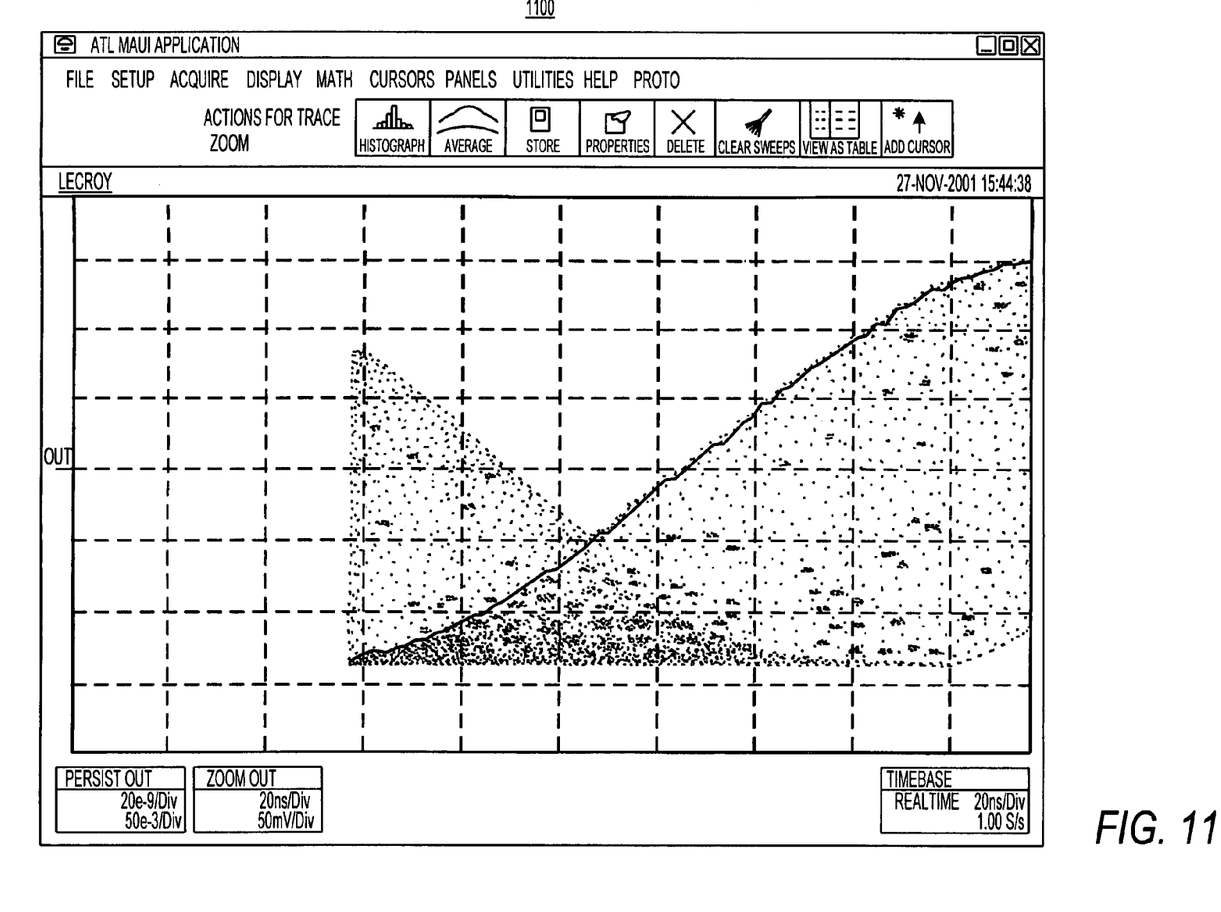
FIG. 11 is an oscilloscope display, as configured by the processing web shown in FIG. 9, showing normal and persistence traces of waveform C1 both zoomed-in in the time axis (x-axis) by the same amount.
Figure 12:
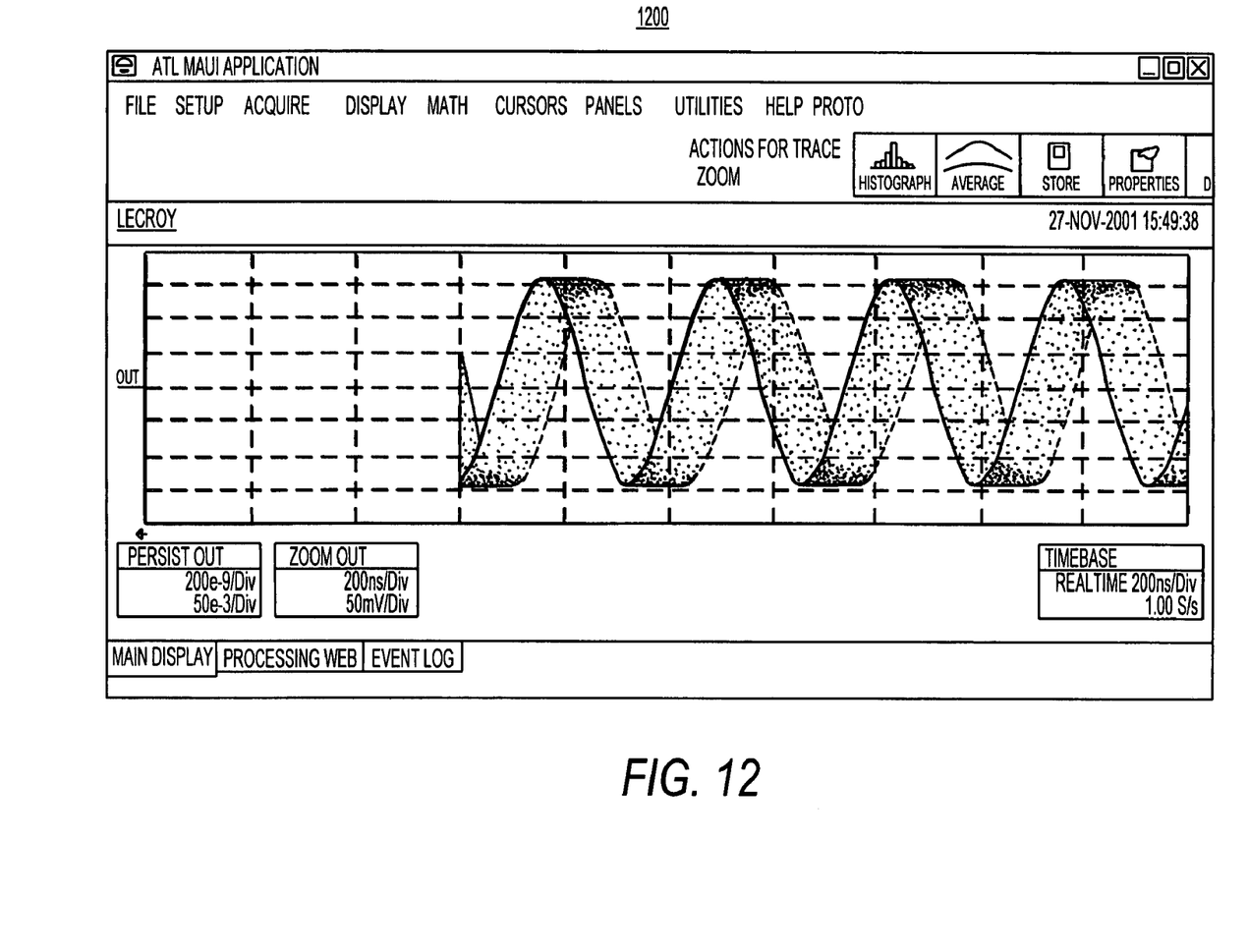
FIG. 12 is an oscilloscope display, as configured by the processing web shown in FIG. 9, showing normal and persistence traces of waveform C1 without zooming.

FIGS. 10, 11, and 12 show an oscilloscope display, as configured by the processing web shown in FIG. 9, showing the normal and persistence traces of waveform C1 both scaled by the same amount, both zoomed-in in the time axis (x-axis) by the same amount, and both not zoomed. Instead of using a processing zoom node in the system, zooming can also be done by simply resizing the display window.

Figure 13:
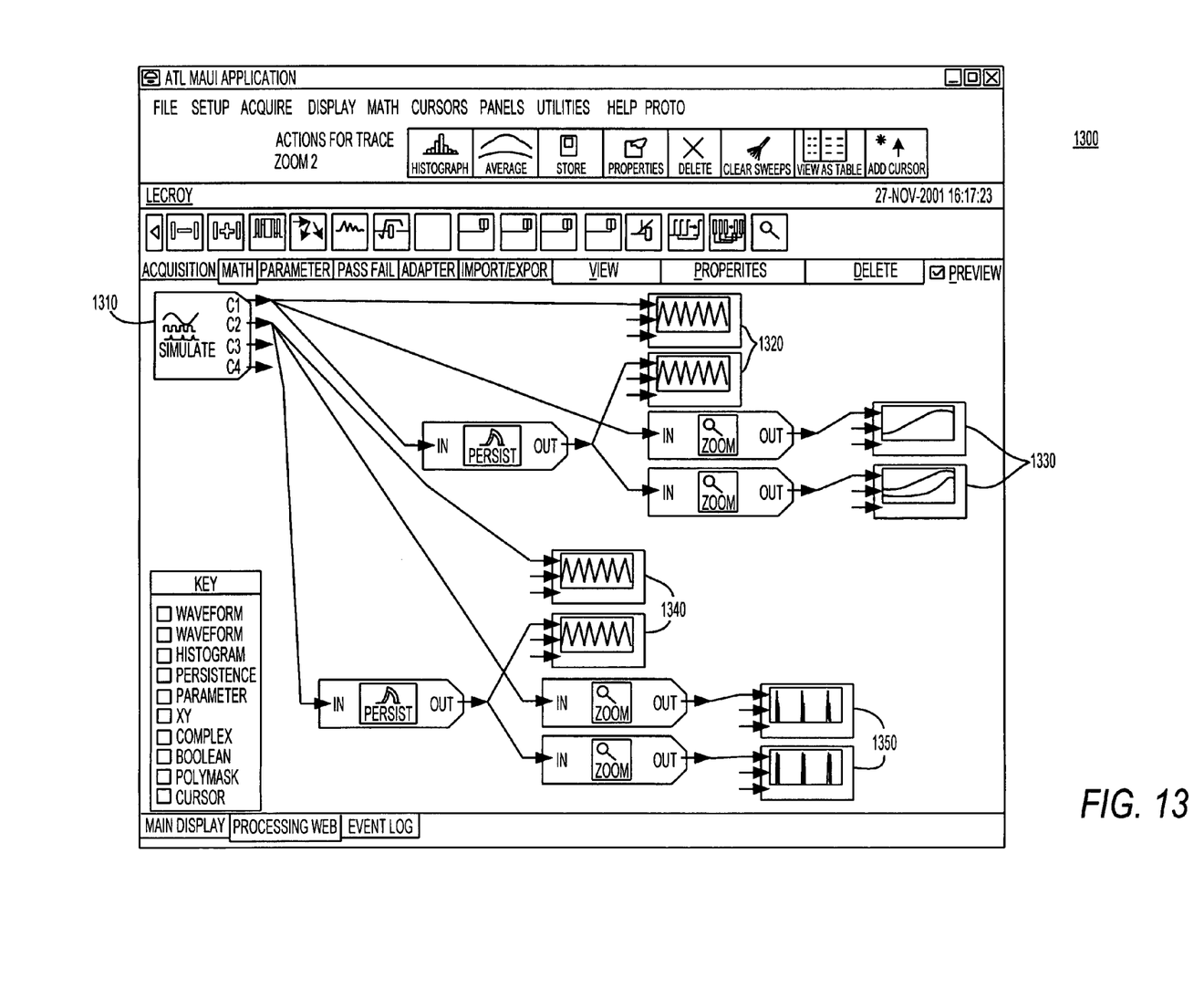
FIG. 13 shows a processing web editing screen for an oscilloscope wherein normal and persistence traces of waveforms C1 and C2 are shown both with and without individual zoom functions in accordance with the invention.

FIG. 13 shows an editing screen 1300 wherein normal and persistence traces of waveforms C1 and C2 are shown on the oscilloscope display both with and without individual zoom functions. Note that each trace may be superimposed on one another using different zoom factors. As in FIG. 1, waveforms C1 and C2 are acquired 1310 and normal and persistence traces of waveforms C1 1320 and C1 1340 are shown. In addition, the original waveforms and the accumulated persistence data for both C1 and C2 are individually connected to zoom functions and displayed 1330, 1350. In this case, the zoom function allows an operator to zoom-in/out on the persistence data independent of the resolution at which it was accumulated. In this manner, the system unlocks the display resolution from the persistence data resolution so that new data does not need to be acquired for each scaling of the display.

Figure 14:
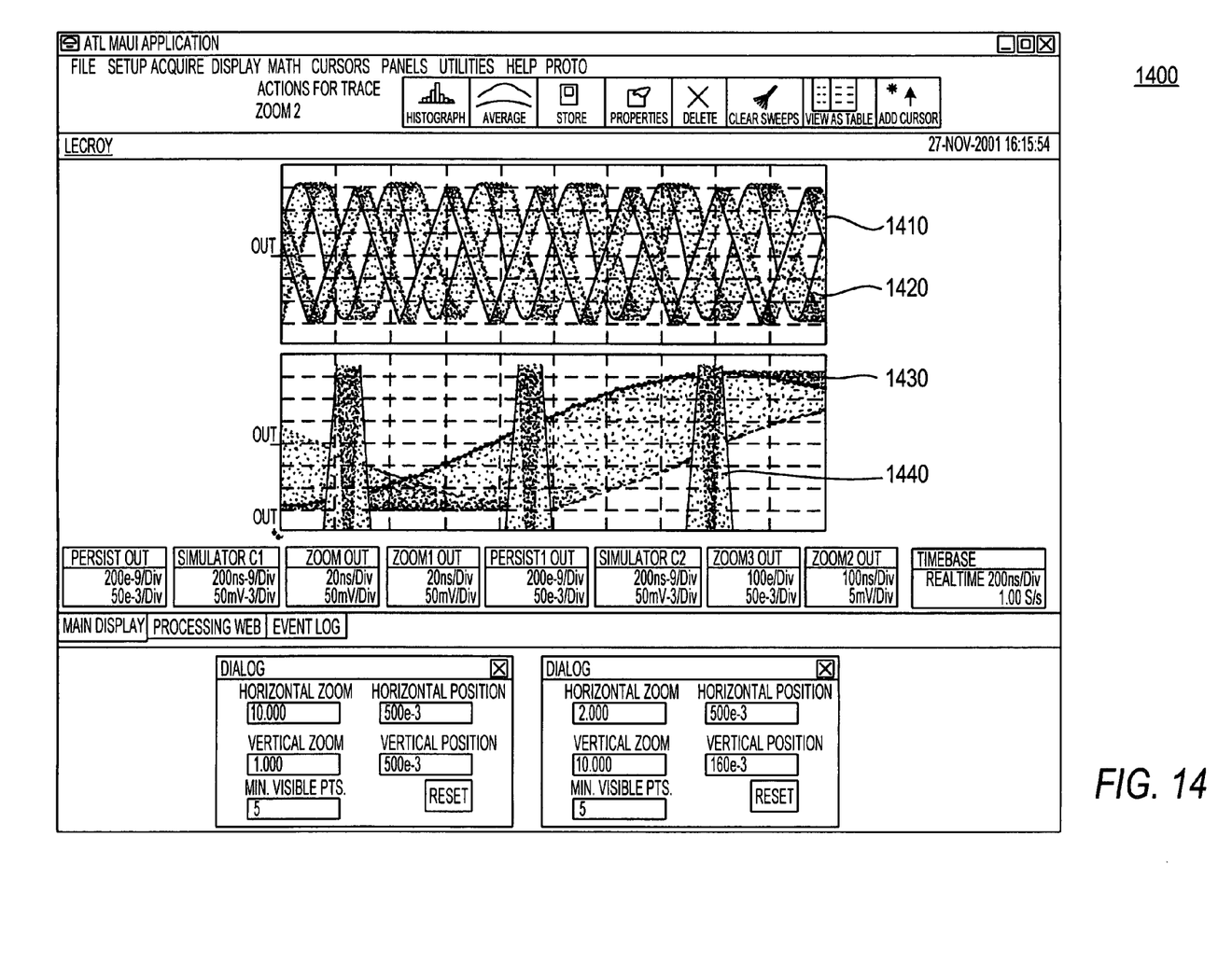
FIG. 14 is an oscilloscope display, as configured by the processing web shown in FIG. 13, showing normal and persistence traces of waveforms C1 and C2 superimposed on the top of the screen, with waveform C1 zoomed-in in the x-axis and waveform C2 zoomed-in a different amount in both the x and y axes superimposed on the bottom of the screen.

FIG. 14 shows an oscilloscope display 1400, as configured by the processing web shown in FIG. 13, showing the normal and persistence traces of waveforms C1 1420 and C2 1410 superimposed on the top of the screen, with waveform C1 zoomed-in in the x-axis 1430 and waveform C2 zoomed-in a different amount in both the x and y axes 1440 superimposed on the bottom of the screen. This figure also shows (at the bottom) the zoom controls an operator can use to select the region he wants view.

Figure 15:
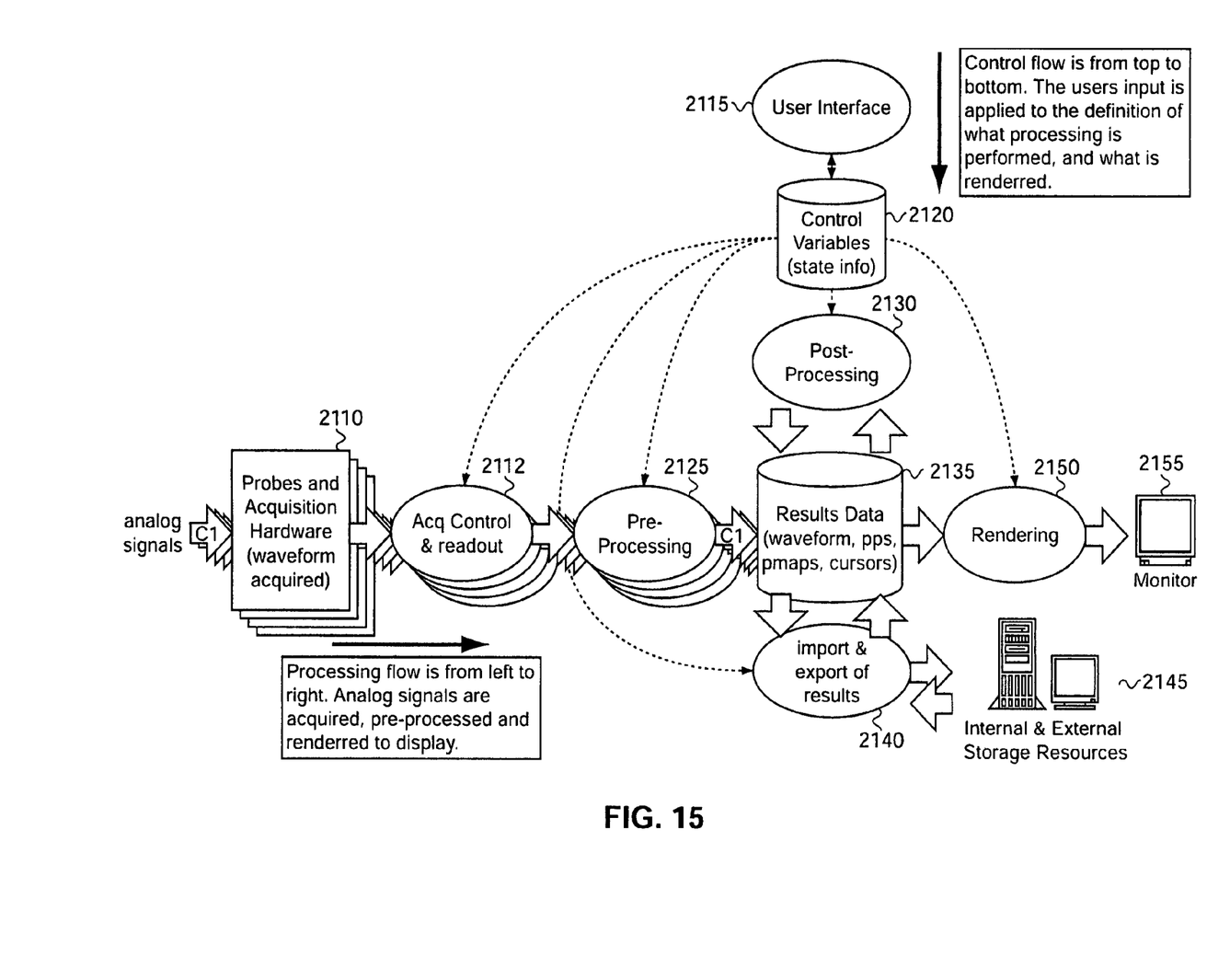
FIG. 15 is a system diagram showing the functional connections in an oscilloscope constructed in accordance with the present invention.

FIG. 15 depicts a conceptualized view of the operation of an oscilloscope in which the invention may be implemented. The flow of data is shown from left to right and control sequences provided by a user, either automated or manual, are shown from top down. As is shown in FIG. 15, a plurality of analog acquisition signals $C_1$ are acquired by the oscilloscope of the invention. These acquisition signals are acquired in accordance with various provided probes and other acquisition hardware 2110 that are in turn controlled by an acquisition control module 2112. Various acquisition control processes are applied to the acquired waveforms in accordance with various control variables 2120 provided by the user via a user interface 2115. These control variables control acquisition control module 2112 as well as all other oscilloscope functioning to be discussed below.

Various results data are then provided to, and thereafter output from a preprocessing system 2125, and are in turn acted upon in various post processing functions 2130 employing user defined control variables 2120, resulting in processed data (Results data) 2135. The post-processed data is then exported and/or imported at 2140 as necessary for further processing by the system 2145, also in accordance with control variables 2120. After processing has been completed, the various processed data is converted for display at 2150 on a display device 2155.

A fundamental difference between this conceptual model and previous oscilloscope models is that the design is completely "modular," whereby the elements comprising the oscilloscope are completely specified in terms of interface and are independent in construction. In most instruments prior to this design there has always been a fixed (and limited) number and configuration of the processing elements. This oscilloscope design employs a "processing web." The functionality of the present invention's scaling of persistence data with interpolation, as described herein, is applicable to this processing web. This processing web is described in U.S. patent application Ser. No. 09/988,420, filed Nov. 16, 2001, the entire contents thereof being incorporated herein by reference.

While a preferred embodiment of the present invention has been described using specific terms, such description is for illustrative purposes only, and it is to be understood that changes and variations may be made without departing from the spirit or scope of the following claims.

What is claimed is:

1. An oscilloscope apparatus for scaling persistence data, said persistence data being a visual trace history of repeatedly captured and stored data, comprising:
    an acquisition unit for acquiring a waveform;
    a results buffer for accumulating persistence data of the acquired waveform, a persistence data size being selectable by a user;
    a processing operator for generating, from the accumulated persistence data, using an interpolation algorithm, second data comprising scaled persistence data, including data information different from the accumulated persistence data, the scaled persistence data being scaled to a display buffer size, and outputting the scaled persistence data to a display buffer of said display buffer size while maintaining the originally accumulated persistence data acquired before scaling, so that both said originally accumulated persistence data and said scaled persistence data may be utilized; and
    a display for displaying the scaled persistence data from said display buffer.

2. The oscilloscope apparatus according to claim 1, further comprising a user interface for selecting a region of said persistence data in said results buffer to be scaled by said processing operator and displayed.

3. The oscilloscope apparatus according to claim 2, wherein said region of said persistence data is of variable size such that said persistence data can be zoomed in/out and centered on the display.

4. The oscilloscope apparatus according to claim 1, wherein said persistence data size is controlled by a zoom function.

5. The oscilloscope apparatus according to claim 1, wherein said interpolation algorithm is selected by the user.

6. The oscilloscope apparatus according to claim 1, wherein said interpolation algorithm is automatically selected by the apparatus.

7. The oscilloscope apparatus according to claim 1, wherein said interpolation algorithm is a standard, bi-linear, bi-cubic, or super-sampling algorithm.

8. The oscilloscope apparatus according to claim 1, wherein said display for displaying the scaled persistence data is an arbitrary display size.

9. An oscilloscope apparatus for displaying persistence data, said persistence data being a visual trace history of repeatedly captured and stored data, comprising:
    an acquisition unit for acquiring a waveform;
    a results buffer for accumulating persistence data of the acquired waveform, a persistence data size being selectable by a user;
    a user interface for selecting a region of said persistence data in said results buffer to be displayed while maintaining the originally accumulated persistence data acquired before scaling;
    a processing operator for generating, from the accumulated persistence data, using an interpolation algorithm second data comprising scaled persistence data including data different from the accumulated persistence data so that both said originally accumulated persistence data and said scaled persistence data may be utilized; and a display for displaying the scaled persistence data corresponding to the selected region of said persistence data.

10. The oscilloscope apparatus according to claim 9, wherein said region of said persistence data is of variable size such that said persistence data can be zoomed in/out and centered on the display.

11. The oscilloscope apparatus according to claim 9, wherein said persistence data size is controlled by a zoom function.

12. The oscilloscope apparatus according to claim 9, further comprising a processing operator for scaling the selected region of said persistence data using an interpolation algorithm to a size of said display.

13. The oscilloscope apparatus according to claim 12, wherein said interpolation algorithm is automatically selected by the apparatus.

14. The oscilloscope apparatus according to claim 12, wherein said interpolation algorithm is a standard, bi-linear, bi-cubic, or super-sampling algorithm.

15. The oscilloscope apparatus according to claim 9, wherein said display for displaying the scaled persistence data is an arbitrary display size.

16. A method of scaling persistence data in an oscilloscope, said persistence data being a visual trace history of repeatedly captured and stored data, comprising the steps of:
   selecting a persistence data size;
   acquiring a waveform;
   accumulating persistence data of said persistence data size from the acquired waveform;
   generating, from the accumulated persistence data, using an interpolation algorithm, second data comprising scaled persistence data, including data information different from the accumulated persistence data, the scaled persistence data being scaled to a display buffer size;
   outputting the scaled persistence data to a display buffer of said display buffer size while maintaining the originally accumulated persistence data acquired before scaling, so that both said originally accumulated persistence data and said scaled persistence data may be utilized; and
   displaying the scaled persistence data from said display buffer on a display.

17. The method according to claim 16, further comprising a step of selecting a region of the persistence data to be scaled in the scaling step.

18. The method according to claim 17, wherein said region of the persistence data is of variable size such that said persistence data can be zoomed in/out and centered when displayed on said display.

19. The method according to claim 16, further comprising a step of selecting a persistence data size using a zoom function.

20. The method according to claim 16, wherein said interpolation algorithm is selected by the user.

21. The method according to claim 16, wherein said interpolation algorithm is automatically selected by the scaling step.

22. The method according to claim 16, wherein said interpolation algorithm is a standard, bi-linear, bi-cubic, or super-sampling algorithm.

23. The method according to claim 16, wherein said display for displaying the scaled persistence data is an arbitrary display size.

24. A method of displaying persistence data in an oscilloscope, said persistence data being a visual trace history of repeatedly captured and stored data, comprising the steps of:
   selecting a persistence data size;
   acquiring a waveform;
   accumulating persistence data of said persistence data size from the acquired waveform;
   selecting a region of said persistence data to be displayed while maintaining the originally accumulated persistence data acquired before scaling;
   generating, from the accumulated persistence data, using an interpolation algorithm second data comprising scaled persistence data including data different from the accumulated persistence data so that both said originally accumulated persistence data and said scaled persistence data may be utilized; and
   displaying the scaled persistence data corresponding to the selected region of said persistence data on a display.

25. The method according to claim 24, further comprising step of scaling the selected region of said persistence data using an interpolation algorithm to a size of said display.

26. The method according to claim 25, wherein said interpolation algorithm is automatically selected by the scaling step.

27. The method according to claim 25, wherein said interpolation algorithm is a standard, bi-linear, bi-cubic, or super-sampling algorithm.

28. The method according to claim 24, wherein said persistence data size is selected by using a zoom function.

29. The method according to claim 24, wherein said region of said persistence data is of variable size such that said persistence data can be zoomed in/out and centered on the display.

30. The method according to claim 24, wherein said display for displaying the scaled persistence data is an arbitrary display size.

* * * * *